United States Patent [19]
Ogawa

[11] Patent Number: 5,436,472
[45] Date of Patent: Jul. 25, 1995

[54] PHOTOINTERRUPTER

[75] Inventor: Kenji Ogawa, Kyoto, Japan

[73] Assignee: Rohm Co., Ltd., Kyoto, Japan

[21] Appl. No.: 305,074

[22] Filed: Sep. 13, 1994

[30] Foreign Application Priority Data

Sep. 20, 1993 [JP] Japan .................. 5-233415

[51] Int. Cl.⁶ .................. H01L 31/0232; H01L 31/12
[52] U.S. Cl. .................. 257/82; 257/433; 257/435
[58] Field of Search .............. 257/81, 82, 83, 435, 257/80, 433

[56] References Cited

FOREIGN PATENT DOCUMENTS

| | | | |
|---|---|---|---|
| 61-53786 | 3/1986 | Japan | 257/82 |
| 61-276381 | 12/1986 | Japan | 257/82 |
| 349404 | 10/1991 | Japan | H01L 31/12 |
| 4-144175 | 5/1992 | Japan | 257/82 |

*Primary Examiner*—Jerome Jackson
*Assistant Examiner*—Donald L. Monin, Jr.
*Attorney, Agent, or Firm*—Michael D. Bednarek

[57] ABSTRACT

A photointerrupter is provided which comprises a resinous hollow holder case including an opposed pair of housing portions separated by an intermediate wall portion for accommodating a light emitting element and a light receiving element, respectively. The photointerrupter further comprises a resinous presser member having an intermediate bonding portion heat-bonded to the intermediate wall portion of the holder case. The presser member has a pair of end support portions held in supporting contact with the light emitting element and the light receiving element, respectively.

4 Claims, 3 Drawing Sheets

PHOTOINTERRUPTER

BACKGROUND OF THE INVENTION

1. Field of the Invention

This invention relates to a photointerrupter of the type which comprises a resinous hollow holder case housing a light emitting element and a light receiving element as opposed to each other.

2. Description of the Related Art

As is well known, a photointerrupter includes, in combination, a light emitting element such as a light emitting diode (LED) and a light receiving element such as a photodiode arranged in opposition to the light emitting element with a suitable spacing. Normally, the light beam generated by the light emitting element reaches the light receiving element. However, if the light beam is interrupted by passage of an object between the two photo elements for example, the light receiving element detects such interruption.

The combination of light emitting and receiving elements may be housed in a hollow holder case which is made of a synthetic resin. The respective photo elements may be fixed in place within the holder case by adhesive bonding, as disclosed in Japanese Utility Model Publication No. 3(1991)-49404 (Published: Oct. 22, 1992) for example.

However, the adhesive bonding is disadvantageous for inefficiency of applying and curing the adhesive. Further, the adhesive bonding is also disadvantageous in that the adhesive may be unexpectedly deposited on the operative surfaces of the respective photo elements. Morever, heat necessary for curing the adhesive may damage one or both of the photo elements.

On the other hand, the Japanese utility model publication also discloses an opposite pair of elastic stoppers integral with the holder case for fixing the respective photo elements. Specifically, the elastic stoppers are arranged and configured such that they are elastically deformed upon insertion of the photo elements into the holder case but restore to their original position into fixing engagement with the thus inserted photo elements. Thus, the provision of the elastic stoppers eliminates the problems encountered by the adhesive bonding. However, the use of the elastic stoppers is still disadvantageous in the following respects.

(1) Due to the presence of the elastic stopper, a mold used for forming the resinous holder case needs to have a relatively complicated configuration, thus resulting in a production cost increase.

(2) The provision of the elastic stoppers will inevitably results in an size increase of the holder case (namely, the photointerrupter itself).

(3) Since the respective photo elements are fixed in place only by the elasticity of the elastic stoppers, the photo elements may unexpectedly displace due to the elasticity of the stoppers, consequently resulting in improper operation of the photointerrupter.

(4) The presence of the elastic stoppers hinders automation with respect to assembly of the photointerrupter, consequently resulting in a production cost increase combined with the complication of the mold.

SUMMARY OF THE INVENTION

It is, therefore, an object of the present invention to provide a photointerrupter which can be rendered compact.

Another object of the present invention is provide a photointerrupter which can be manufactured and assembled easily and efficiently at a relatively low cost.

A further object of the present invention is to provide a photointerrupter wherein the light emitting and receiving elements are reliably held in place within the holder case.

According to the present invention, there is provided a A photointerrupter comprising: a resinous hollow holder case including an opposed pair of housing portions, and an intermediate wall portion disposed between the pair of housing portions; a light emitting element received in one of the housing portions; a light receiving element received in the other of the housing portions; and a resinous presser member having an intermediate bonding portion heat-bonded to the intermediate wall portion of the holder case, the presser member having a pair of end support portions held in supporting contact with the light emitting element and the light receiving element, respectively.

With the arrangement described above, the presser member may be prepared separately from the holder case, so that a mold for forming the presser holder case need not have a complicated configuration. The omission of the elastic engaging portions, which are present in the prior art photointerrupter, also contributes to a size reduction of the holder case (i.e., the photointerrupter as a whole).

The end support portions of the presser member come into pressing contact with the light emitting and receiving elements, respectively, due to temporary melting of resin at the time of heat-bonding the intermediate bonding portion of the presser member to the intermediate wall portion of the holder case. The respective photo elements can be reliably and firmly fixed in place within the holder case.

In assembly, the respective photo elements need only be inserted into the holder case without any need for elastically deforming any parts of the holder case, followed by simple insertion and heat-bonding of the presser member. Thus, the assembling operation can be readily automated to decrease the production cost.

According to a preferred embodiment of the present invention, at least one of the intermediate wall portion of the holder case and the intermediate bonding portion of the presser member is provided with an integral projection for heat-bonding to the other of the intermediate wall portion of the holder case and the intermediate bonding portion of the presser member. Specifically, the integral projection may be provided on the intermediate wall portion of the holder case alone, or on the intermediate bonding portion of the presser member alone, or on both the intermediate wall portion of the holder case and the intermediate bonding portion of the presser member. The integral projection provides a location where supersonic vibratory energy concentrates for accelerating heat-fusion.

Further, the end support portions of the presser member may extend substantially perpendicularly to the intermediate bonding portion into the respective housing portions. In this case, it is advantageous that the end support portions have respective positioning lips for preventing the light emitting and receiving elements from displacing toward or away from each other.

Other objects, features and advantages of the present invention will be fully understood from the following detailed description given with reference to the accompanying drawings.

DETAILED DESCRIPTION OF THE PREFERRED EMBODIMENT

Figure 1:
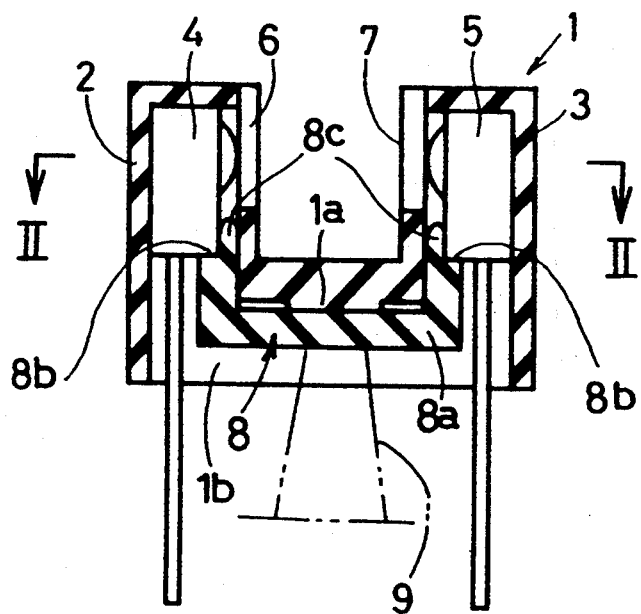
FIG. 1 is a front view, in vertical section, showing a photointerrupter embodying the present invention.
Figure 2:
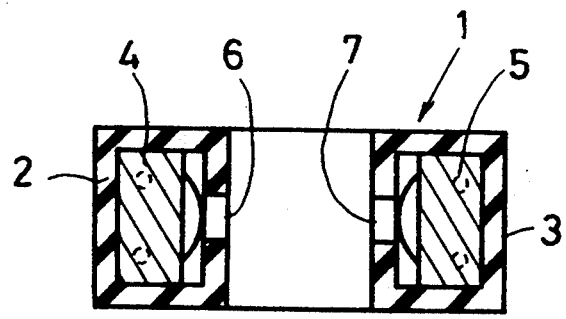
FIG. 2 is a sectional view taken on lines II—II in FIG. 1.

Referring to FIGS. 1 to 4 of the accompanying drawings, there is illustrated a photointerrupter according to a preferred embodiment of the present invention. The photointerrupter mainly comprises a holder case 1, a light emitting element (e.g. light emitting diode) 4, a light receiving element (e.g. phototransistor or photodiode) 5, and a presser member 8.

The holder case 1 is a hollow member made of a synthetic resin such as epoxy. The holder case 1 has a first housing portion 2 for accommodating the light emitting element 4, and a second housing portion 3 for accommodating the light receiving element 5 in opposed relation to the light emitting element 4. The first and second housing portions 2, 3 have respective windows 6, 7 opposed to each other, so that the light beam from the light emitting element 4 can be detected by the light receiving element 5 unless interrupted therebetween.

Figure 3:
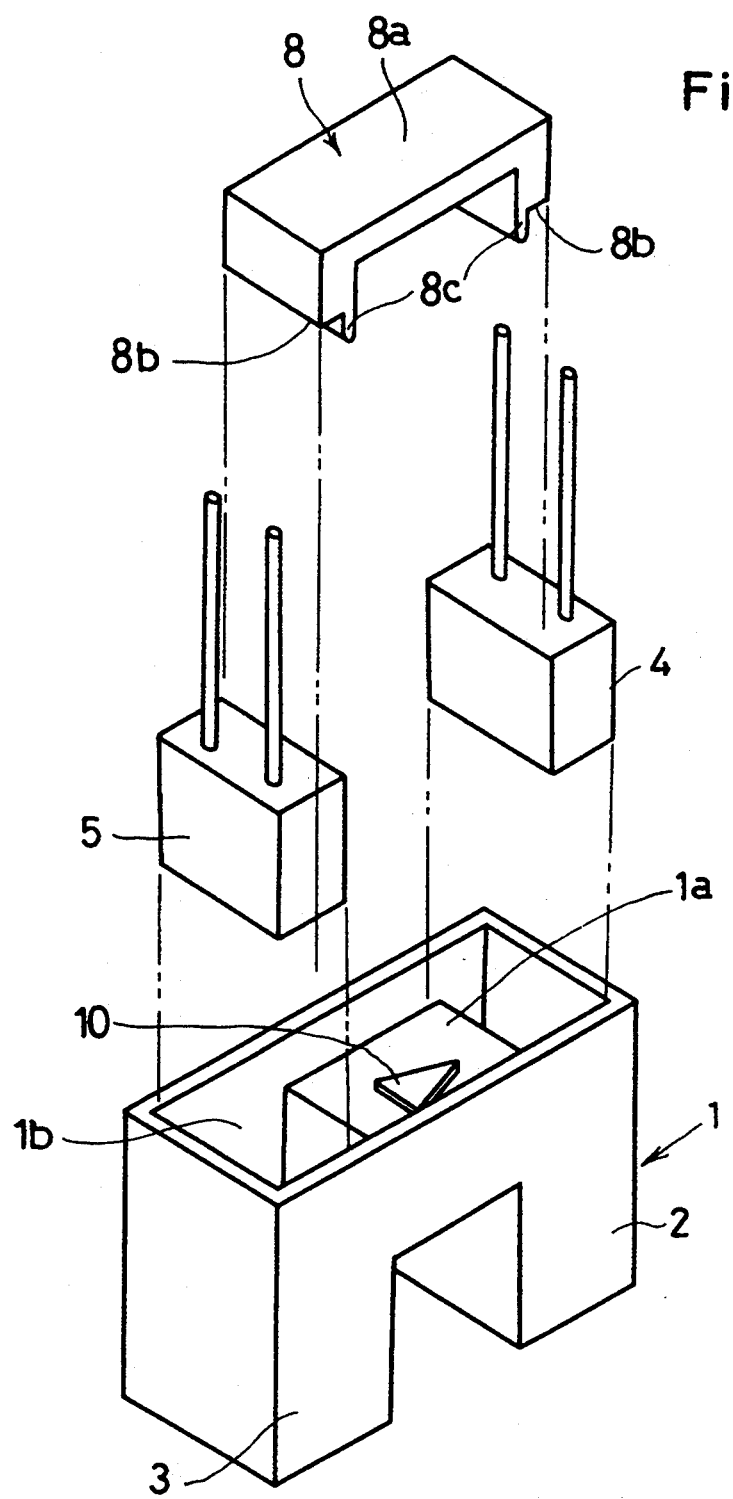
FIG. 3 is an exploded perspective view showing the same photointerrupter.
Figure 4:
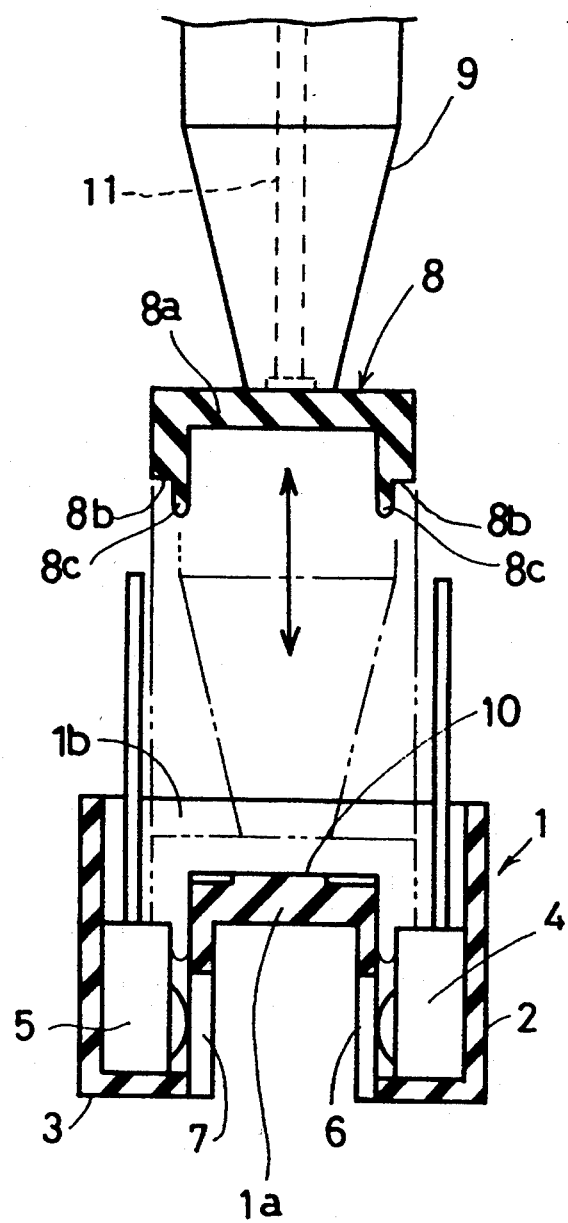
FIG. 4 is a sectional view showing the process of assembling the same photointerrupter.

As shown in FIGS. 1, 3 and 4, the holder case 1 has an intermediate wall portion 1a between the respective housing portions 2, 3. Further, the case 1 has an access opening 1b for inserting the light emitting and receiving elements 4, 5, respectively, at the time of assembly, as described later.

The presser member 8 is also made of a synthetic resin such as epoxy. The presser member 8 has an intermediate bonding portion 8a, and a pair of support portions 8b projecting substantially perpendicularly from the intermediate bonding portion 8a at both ends thereof. The intermediate bonding portion 8a is pressed against and supersonically heat-fused (heat-sealed) to the intermediate wall portion 1a of the holder case 1 by bringing a horn 9 of a supersonic heat bonder (FIG. 1). In this heat-bonded state, the support portions 8b of the presser member 8 extend into the first and second housing portions 2, 3, respectively, to come into supporting contact with the respective elements 4, 5. In this way, the respective elements 4, 5 are reliably fixed in place within the respective housing portions 2, 3.

Preferably, the support portions 8b of the presser member 8 have respective positioning lips 8c which come into engagement with the respective operative faces of the light emitting and receiving elements 4, 5. As a result, the elements 4, 5 are prevented from unexpectedly displacing toward or away from each other.

Further preferably, the intermediate wall portion 1a of the holder case 1 has an integral projection 10 for contact with the intermediate bonding portion 8a of the presser member 8. At the time of supersonic heat-fusion, the supersonic energy concentrates locally at the projection 10 to accelerate thermal melting of resin, and such melting quickly propagates laterally. As a result, it is possible to perform reliable supersonic heat-bonding in a shorter time than if no such projection is provided.

Alternatively, a similar projection may be integrally formed on the intermediate bonding portion 8a of the presser member in place of or in addition to the projection 10 of the holder case 1.

In assembly, the holder case 1 is arranged with its access opening 1b directed upward, as shown in FIGS. 3 and 4. Then, the light emitting and receiving elements 4, 5 are inserted through the access opening 1b into the first and second housing portions 2, 3 of the case 1. Then, the presser member 8 is introduced into the case 1 through the access opening 1b so that the intermediate bonding portion 8a of the presser member 8 comes into contact with the intermediate wall portion 1a of the case 1. Finally, the horn 9 of the supersonic heat-bonder is pressed against the intermediate bonding portion 8a of the presser member 8 and supersonically actuated for heat-fusing the presser member 8 to the intermediate wall portion 1a of the holder case 1.

As clearly illustrated in FIG. 4, the horn 9 may be preferably provided with a suction port 11 which is connected to a vacuum source (not shown) and open toward the presser member 8. The suction port 11 enables the horn 9 to hold the presser member 8 for insertion into the holder case 1, which operation is immediately followed by application of supersonic vibration. Thus, it is possible to greatly enhance the production efficiency.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

I claim:

1. A photointerrupter comprising:
   a resinous hollow holder case including an opposed pair of housing portions, and an intermediate wall portion disposed between the pair of housing portions;
   a light emitting element received in one of the housing portions;
   a light receiving element received in the other of the housing portions and separated from the light emitting element by a predetermined spacing;
   a resinous presser member having an intermediate bonding portion that is heat-bonded to a portion of the intermediate wall portion of the holder case so that the presser member and intermediate bonding portion are bonded to one another along a distance that is smaller than the spacing between the light emitting element and the light receiving element, the presser member having a pair of end support portions held in supporting contact with the light emitting element and the light receiving element, respectively.

2. The photointerrupter according to claim 1, wherein at least one of the intermediate wall portion of the holder case and the intermediate bonding portion of the presser member is provided with an integral projection for heat-bonding to the other of the intermediate wall portion of the holder case and the intermediate bonding portion of the presser member.

3. The photointerrupter according to claim 1, wherein the end support portions of the presser member are bent to extend substantially perpendicularly to the intermediate bonding portion of the presser member into the respective housing portions.

4. The photointerrupter according to claim 1, wherein the end support portions have respective positioning lips for preventing the light emitting and receiving elements from displacing toward or away from each other, each of the positioning lips being interposed between the intermediate wall portion of the holder case and a corresponding one of the light emitting and receiving elements.

* * * * *